United States Patent
Chen et al.

(10) Patent No.: US 10,115,758 B2
(45) Date of Patent: Oct. 30, 2018

(54) ISOLATION STRUCTURE FOR REDUCING CROSSTALK BETWEEN PIXELS AND FABRICATION METHOD THEREOF

(71) Applicant: TAIWAN SEMICONDUCTOR MANUFACTURING CO., LTD., Hsinchu (TW)

(72) Inventors: Kai-Yi Chen, Changhua County (TW); Chih-Fei Lee, Tainan (TW); Fu-Cheng Chang, Tainan (TW); Ching-Hung Kao, Tainan (TW); Chia-Pin Cheng, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/452,935

(22) Filed: Mar. 8, 2017

(65) Prior Publication Data

US 2018/0166476 A1    Jun. 14, 2018

Related U.S. Application Data

(60) Provisional application No. 62/431,523, filed on Dec. 8, 2016.

(51) Int. Cl.
*H01L 31/0232* (2014.01)
*H01L 27/146* (2006.01)

(52) U.S. Cl.
CPC .... *H01L 27/1463* (2013.01); *H01L 27/14621* (2013.01); *H01L 27/14685* (2013.01); *H01L 27/14687* (2013.01)

(58) Field of Classification Search
CPC ......... H01L 27/14621; H01L 27/14685; H01L 27/1464; H01L 27/1463; H01L 27/14687; H01L 27/14643
USPC ........................................................ 257/432
See application file for complete search history.

(56) References Cited

U.S. PATENT DOCUMENTS

| | | | |
|---|---|---|---|
| 2004/0058526 A1* | 3/2004 | Cowley ............. | H01L 21/76814 438/637 |
| 2007/0080336 A1* | 4/2007 | Jang ................... | H01L 27/14609 257/6 |
| 2008/0093695 A1* | 4/2008 | Gao ................... | H01L 27/14636 257/428 |
| 2017/0062512 A1* | 3/2017 | Chou ................ | H01L 27/14687 |

* cited by examiner

*Primary Examiner* — Theresa T Doan
(74) *Attorney, Agent, or Firm* — McClure, Qualey & Rodack, LLP

(57) ABSTRACT

A semiconductor device and a method for fabricating the same are provided. In the method for fabricating the semiconductor device, at first, a semiconductor substrate is provided. Then, a trench is formed in the semiconductor substrate. Thereafter, a dielectric layer is formed to cover the semiconductor substrate, in which the dielectric layer has a trench portion located in the trench of the semiconductor substrate. Then, a reflective material layer is formed on the trench portion of the dielectric layer. Thereafter, the reflective material layer is etched to form an isolation structure, in which the isolation structure includes a top portion located on the semiconductor substrate and a bottom portion located in a trench formed by the trench portion of the dielectric layer.

20 Claims, 18 Drawing Sheets

"ISOLATION STRUCTURE FOR REDUCING CROSSTALK BETWEEN PIXELS AND FABRICATION METHOD THEREOF"

RELATED APPLICATION

This application claims the benefit of the Provisional Application Ser. No. 62/431,523, filed Dec. 8, 2016. The entire disclosures of all the above applications are hereby incorporated by reference herein.

BACKGROUND

In semiconductor technology, image sensors are used for sensing light emitted towards them to form an image. For converting various photo energy of the light into electrical signals, the image sensor includes pixels having photosensitive diodes, reset transistors, source follower transistors, pinned layer photodiodes, and/or transfer transistors. In general, the image sensor may be a complementary metal-oxide-semiconductor (CMOS) image sensor (CIS), an active-pixel sensor (APS), a passive-pixel sensor and a charged-coupled device (CCD) sensor. The above image sensor is widely used in various applications such as digital camera or mobile phone camera devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
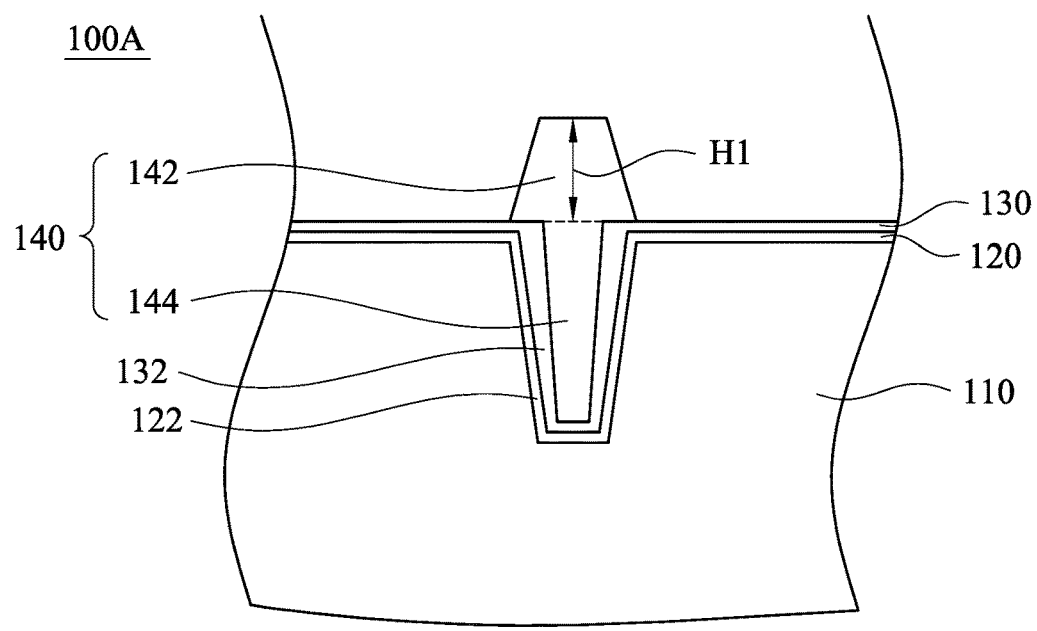
FIG. 1A is a schematic cross-sectional view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Embodiments of the present disclosure are directed to a method for fabricating an isolation structure used in an image sensor to reduce crosstalk between pixels of the image sensor. In the method, at first, a semiconductor substrate is provided. Then, a trench is formed in the semiconductor substrate. Thereafter, a dielectric layer is formed to cover the semiconductor substrate, in which the dielectric layer has a trench portion located in the trench of the semiconductor substrate. Then, a reflective material layer is formed on the trench portion of the dielectric layer. Thereafter, the reflective material layer is etched to form an isolation structure, in which the isolation structure includes a top portion located on the semiconductor substrate and a bottom portion located in a trench formed by the trench portion of the dielectric layer. Since the isolation structure is formed by etching the reflective material, cost of the method for fabricating the isolation structure is reduced.

Referring to FIG. 1A, FIG. 1A is a schematic cross-sectional view of a semiconductor device 100A in accordance with some embodiments of the present disclosure. The semiconductor device 100A includes a semiconductor substrate 100, a first dielectric layer 120, a second dielectric layer 130, and an isolation structure 140. In some embodiments, the semiconductor substrate 110 may be a semiconductor material and may include structures including a graded layer or a buried oxide, for example. In some exemplary examples, the semiconductor substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 110. Alternatively, the semiconductor substrate 110 may be an active layer of a semiconductor-on-insulator (SOI) substrate or a multi-layered structure such as a silicon-germanium layer formed on a bulk silicon layer.

The first dielectric layer 120 covers the semiconductor substrate 110 and has a trench portion 122 located in a trench of the semiconductor substrate 110. In this embodiment, the trench portion 122 is conformal to the trench of the semiconductor substrate 110, but embodiments of the present invention are not limited thereto. The second dielectric layer 130 covers the first dielectric layer 120 and has a trench portion 132 located in a trench formed by the trench portion 122.

In some embodiments, the first dielectric layer 120 and the second dielectric layer 130 are formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HMO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO2-Al2O3) alloy, or another suitable material.

In some embodiments, the first dielectric layer 120 and the second dielectric layer 130 can be formed by a deposition process such as an atomic layer deposition (ALD). Other methods to form the first dielectric layer 120 and the second dielectric layer 130 include chemical vapor deposition (CVD), physical vapor deposition (PVD), and plasma enhanced chemical vapor deposition (PECVD).

The isolation structure 140 includes a top portion 142 and a bottom portion 144. The top portion 142 of the isolation structure 140 is located on the second dielectric layer 130 and covers the trench portion 132 of the second dielectric layer 130. The bottom portion 144 of the isolation structure 140 extends in a trench formed by the trench portion 132 of the second dielectric layer 130 from the top portion 142 of the isolation structure 140. In some embodiments, a height H1 of the top portion 142 of the isolation structure 140 is substantially in a range from 1000 angstrom (Å) to 5000 angstrom.

The isolation structure 140 is formed by a reflective material capable of reflecting light emitted to the isolation structure 140. In some embodiments, the reflective material includes metal, such as aluminum, tungsten, copper, tantalum, titanium, alloys thereof, or combinations thereof. In some embodiments, the isolation structure 140 can be formed by a deposition process such as an atomic layer deposition (ALD). Other methods to form the isolation structure 140 include chemical vapor deposition (CVD), physical vapor deposition (PVD), and plasma enhanced chemical vapor deposition (PECVD).

The isolation structure 140 is used in an image sensor to provide an isolation function to reduce crosstalk between pixels of the image sensor. In some embodiments, the isolation structure 140 is formed between two pixel regions of the image sensor, and the light of the two pixel regions are isolated from each other, since the isolation structure 140 is capable of reflecting light.

Further, in this embodiment, the semiconductor device 100A includes two dielectric layers 120 and 130 formed between the semiconductor substrate 110 and the isolation structure 140, but embodiments of the present disclosure are not limited thereto. In some embodiments, the semiconductor device 100A includes one dielectric layer formed between the semiconductor substrate 110 and the isolation structure 140. In some embodiments, the semiconductor device 100A includes three or more dielectric layers formed between the semiconductor substrate 110 and the isolation structure 140.

Figure 1B:
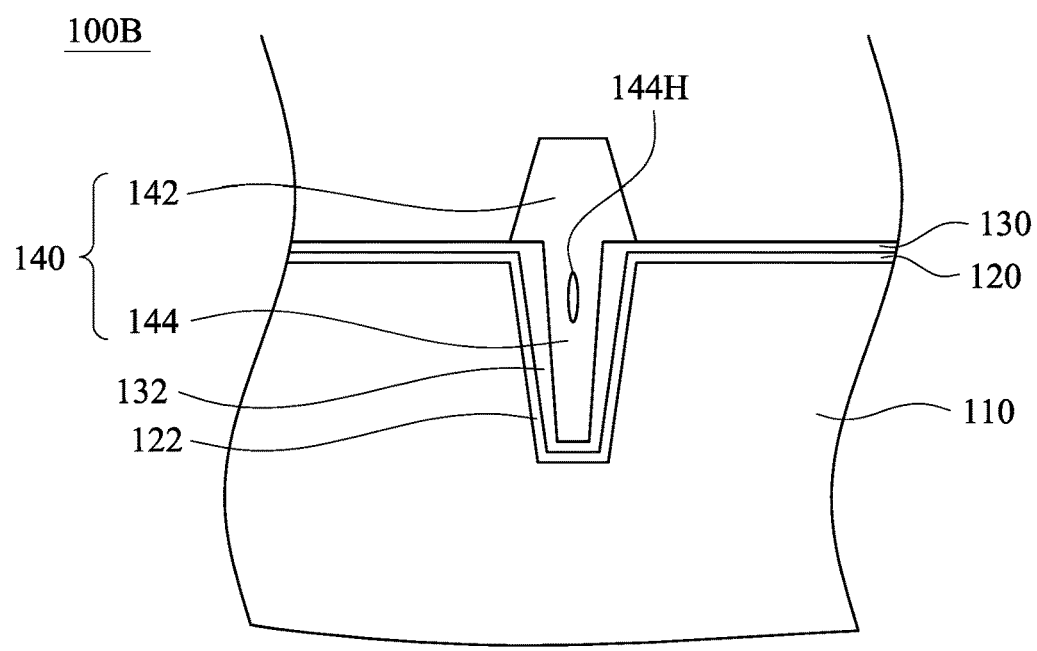
FIG. 1B is a schematic cross-sectional view of a semiconductor device in accordance with some embodiments of the present disclosure.

Referring to FIG. 1B, FIG. 1B is a schematic cross-sectional view of a semiconductor device 100B in accordance with some embodiments of the present disclosure. The semiconductor device 100B is similar to the semiconductor device 100A, but the difference is in that the bottom portion 144 of the isolation structure 140 includes a cavity 144H. In some embodiments, during the deposition process for forming the isolation structure 140, the cavity 144H may be formed in the bottom portion 144 of the isolation structure 140.

Figure 2A:
FIG. 2A to FIG. 2I are cross-sectional views of intermediate stages showing a method for fabricating a semiconductor device including an isolation structure in accordance with some embodiments of the present disclosure.

FIG. 2A to FIG. 2I are cross-sectional views of intermediate stages showing a method for fabricating a semiconductor device including an isolation structure in accordance with some embodiments of the present disclosure. At first, a semiconductor substrate 210 is provided as shown in FIG. 2A. In some embodiments, the semiconductor substrate 210 may be a semiconductor material and may include structures including a graded layer or a buried oxide, for example. In some exemplary examples, the semiconductor substrate 210 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 210. Alternatively, the semiconductor substrate 210 may be an active layer of a semiconductor-on-insulator (SOI) substrate or a multi-layered structure such as a silicon-germanium layer formed on a bulk silicon layer.

Figure 2B:
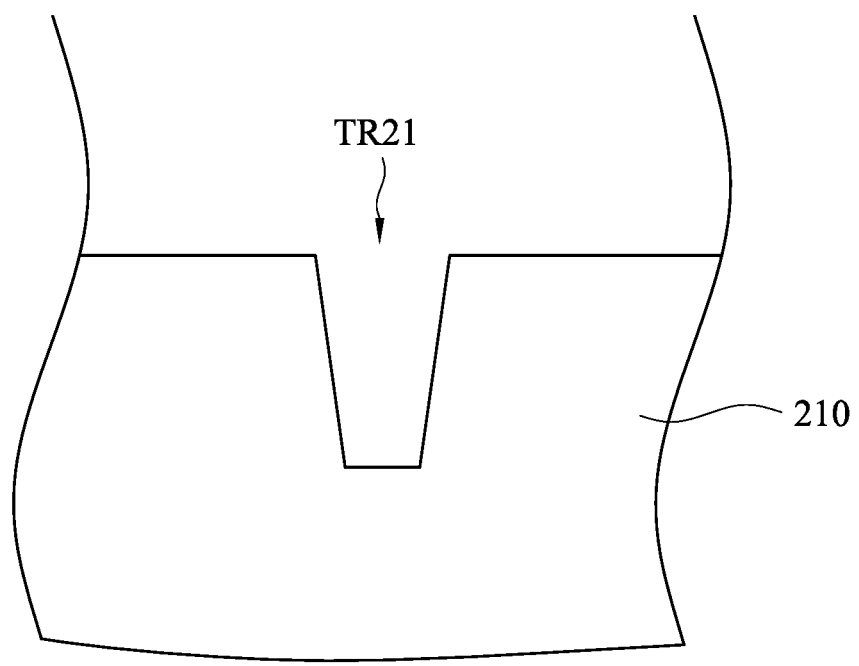

Then, a trench TR21 is formed in the semiconductor substrate 210 as shown in FIG. 2B. The trench TR21 can be formed by a wet etching process or a dry etching process. However, embodiments of the present disclosure are not limited thereto.

Figure 2C:
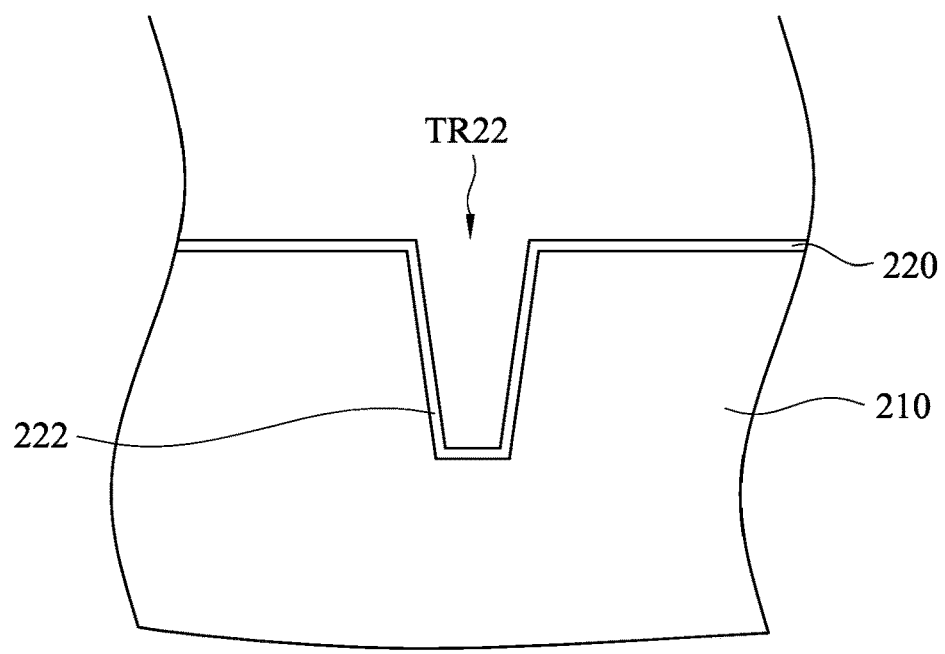

Thereafter, a first dielectric layer 220 is formed on the semiconductor substrate 210 as shown in FIG. 2C. The first dielectric layer 220 covers the semiconductor substrate 210 and includes a trench portion 222 formed in the trench TR21. The trench portion 222 is formed along sidewalls and a bottom of the trench TR21, thereby forming a trench TR22. In this embodiment, the trench portion 222 of the first dielectric layer 220 is conformal to the trench TR21, but embodiments of the present disclosure are not limited thereto.

In some embodiments, the first dielectric layer 220 is formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO2-Al2O3) alloy, or another suitable material.

In some embodiments, the first dielectric layer 220 can be formed by a deposition process such as an atomic layer deposition (ALD). Other methods to form the first dielectric layer 220 include chemical vapor deposition (CVD), physical vapor deposition (PVD), and plasma enhanced chemical vapor deposition (PECVD).

Figure 2D:
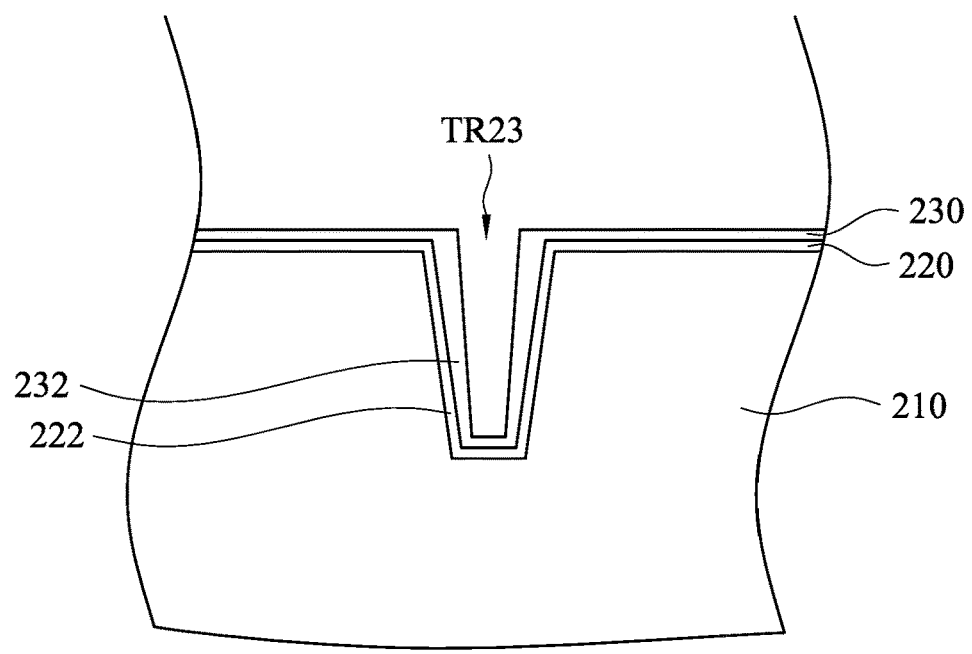

Then, a second dielectric layer 230 is formed on the first dielectric layer 220 as shown in FIG. 2D. The second dielectric layer 230 covers the first dielectric layer 220 and includes a trench portion 232 formed in the trench TR22.

The trench portion 232 is formed along the trench portion 222 of the first dielectric layer 220, thereby forming a trench TR23.

In some embodiments, the second dielectric layer 230 is formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO2-Al2O3) alloy, or another suitable material.

In some embodiments, the second dielectric layer 230 can be formed by a deposition process such as an atomic layer deposition (ALD). Other methods to form the second dielectric layer 230 include chemical vapor deposition (CVD), physical vapor deposition (PVD), and plasma enhanced chemical vapor deposition (PECVD).

Figure 2E:
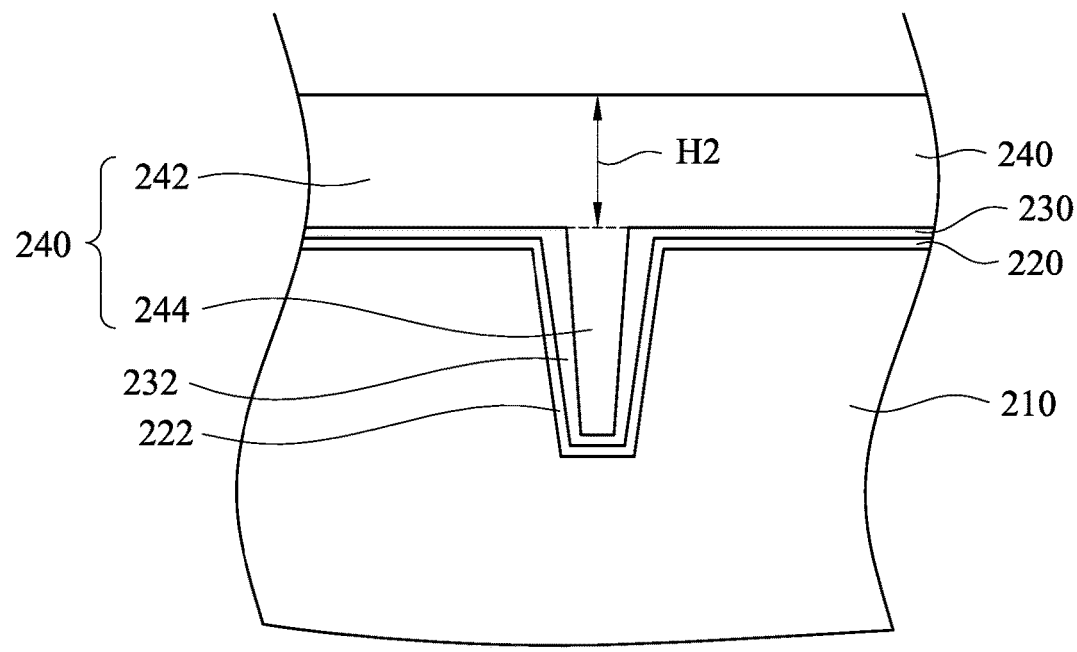

Thereafter, a reflective material layer 240 is formed on the trench portion 232 of the second dielectric layer 230 as shown in FIG. 2E. The reflective material layer 240 covers the second dielectric layer 230 and includes a top portion 242 and a bottom portion 244. The bottom portion 244 of the reflective material layer 240 is formed in the trench TR23, and the top portion 242 of the reflective material layer 240 is located on the bottom portion 244 of the reflective material layer 240. In some embodiments, the top portion 242 of the reflective material layer 240 has a height H2 in a range from 1000 angstrom (Å) to 5000 angstrom.

The reflective material layer 240 is capable of reflecting light. In some embodiments, the reflective material layer 240 can be formed by metal, such as aluminum, tungsten, copper, tantalum, titanium, alloys thereof, or combinations thereof. In some embodiments, the reflective material layer 240 can be formed by a deposition process such as an atomic layer deposition (ALD). Other methods to form the reflective material layer 240 include chemical vapor deposition (CVD), physical vapor deposition (PVD), and plasma enhanced chemical vapor deposition (PECVD).

Figure 2F:
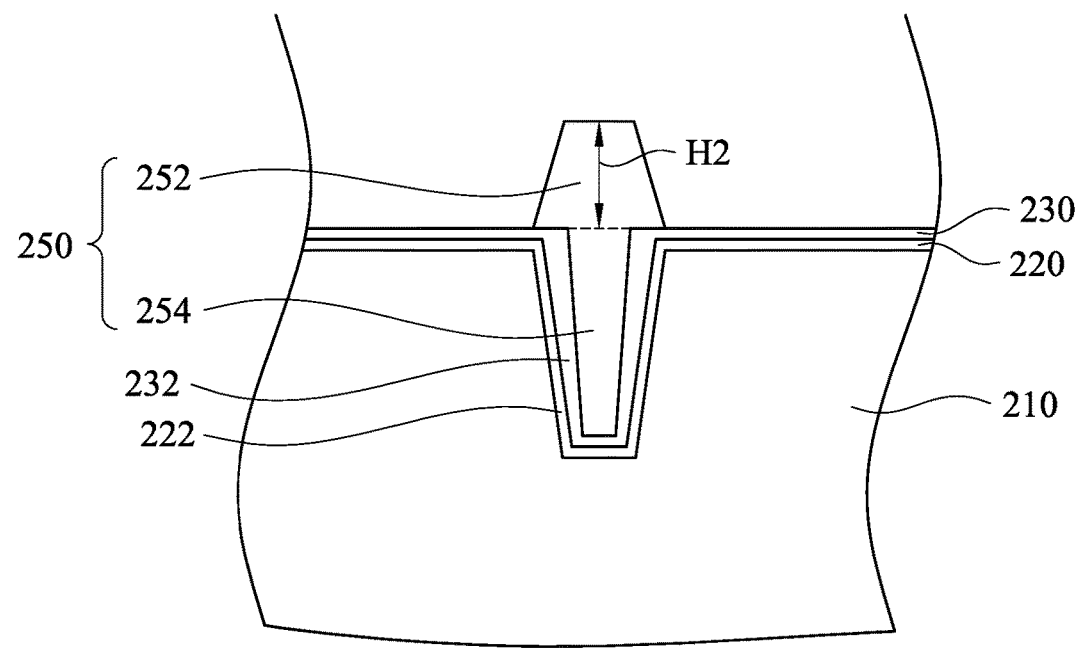

Then, the reflective material layer 240 is etched to form an isolation structure 250 as shown in FIG. 2F. The isolation structure 250 includes a top portion 252 and a bottom portion 254. In this embodiment, the top portion 242 of the reflective material layer 240 is etched to form the top portion 252 of the isolation structure 250, and the bottom portion 244 of reflective material layer 240 located in the trench TR23 is not etched and can be considered as the bottom portion 254 of the isolation structure 250. Therefore, the bottom portion 254 of the isolation structure 250 extends in the trench TR23 from the top portion 252 of the isolation structure 250. In some embodiments, the top portion 252 of the isolation structure 250 has a height the same as the height H2 of the top portion 242 of the reflective material layer 240.

Figure 2G:
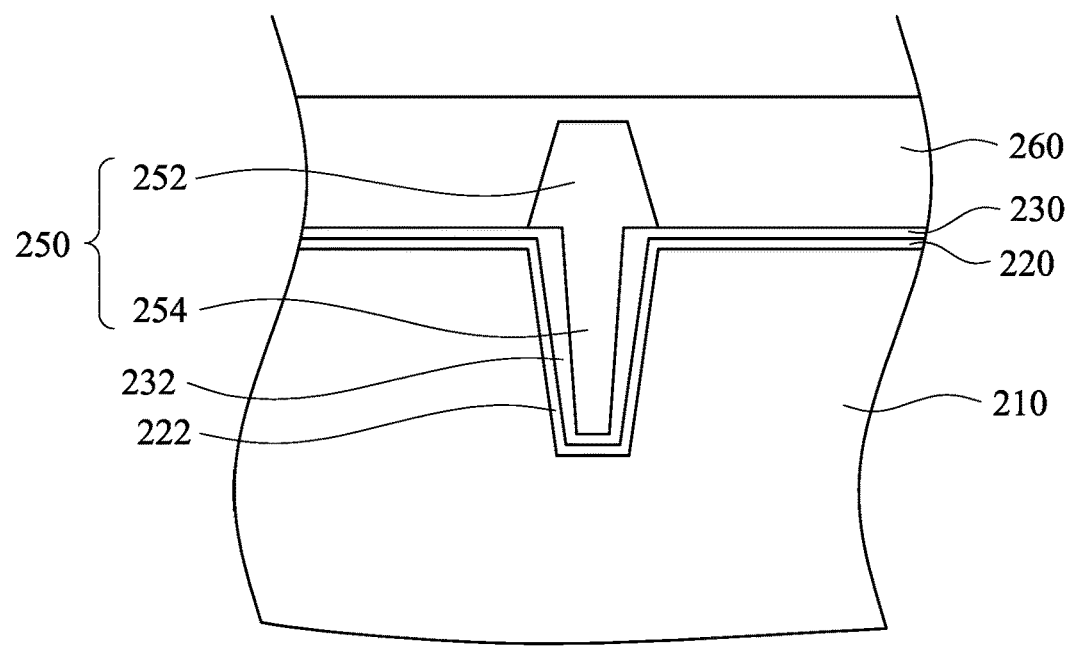

Thereafter, a passivation layer 260 is formed on the isolation structure 250 as shown in FIG. 2G. The passivation layer 260 is used to prevent the isolation structure 250 from being damaged. For example, the isolation structure 250 may be oxidized when being exposed to air. In this embodiment, the passivation layer 260 is an oxide layer, but embodiments of the present disclosure are not limited thereto.

Figure 2H:
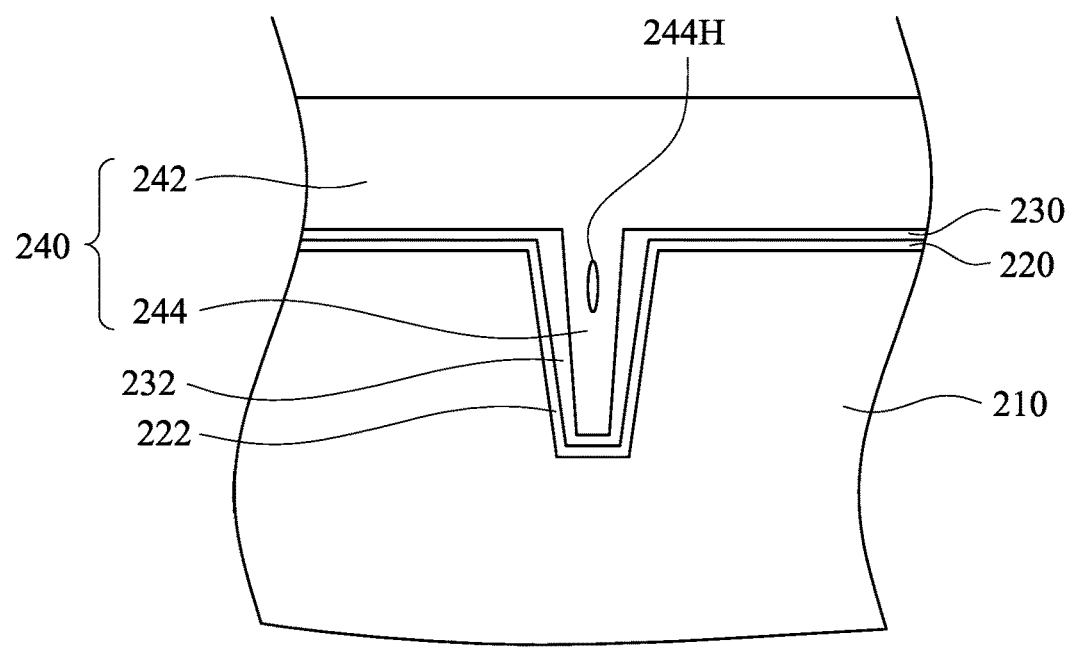
Figure 2I:
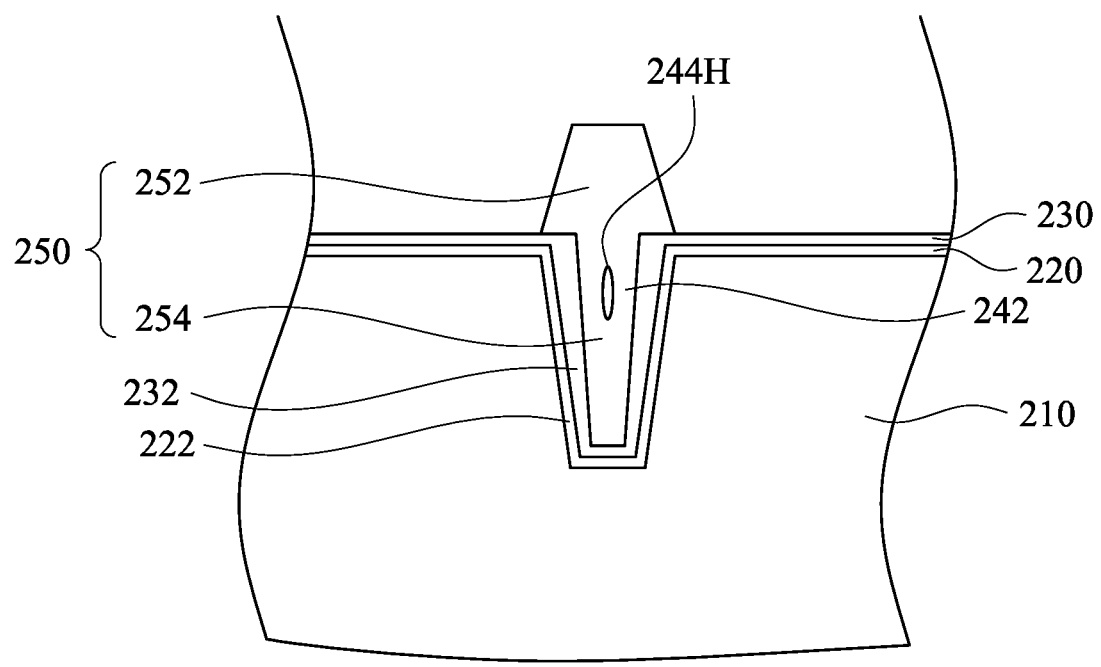

Further, in some embodiments, during the deposition process for depositing the reflective material layer 240, a cavity 244H may be formed in the bottom portion 244 of the reflective material layer 240 as shown in FIG. 2H. Then, the isolation structure 250 formed by etching the reflective material layer 240 has the cavity 244H as shown in FIG. 2I.

Figure 3:
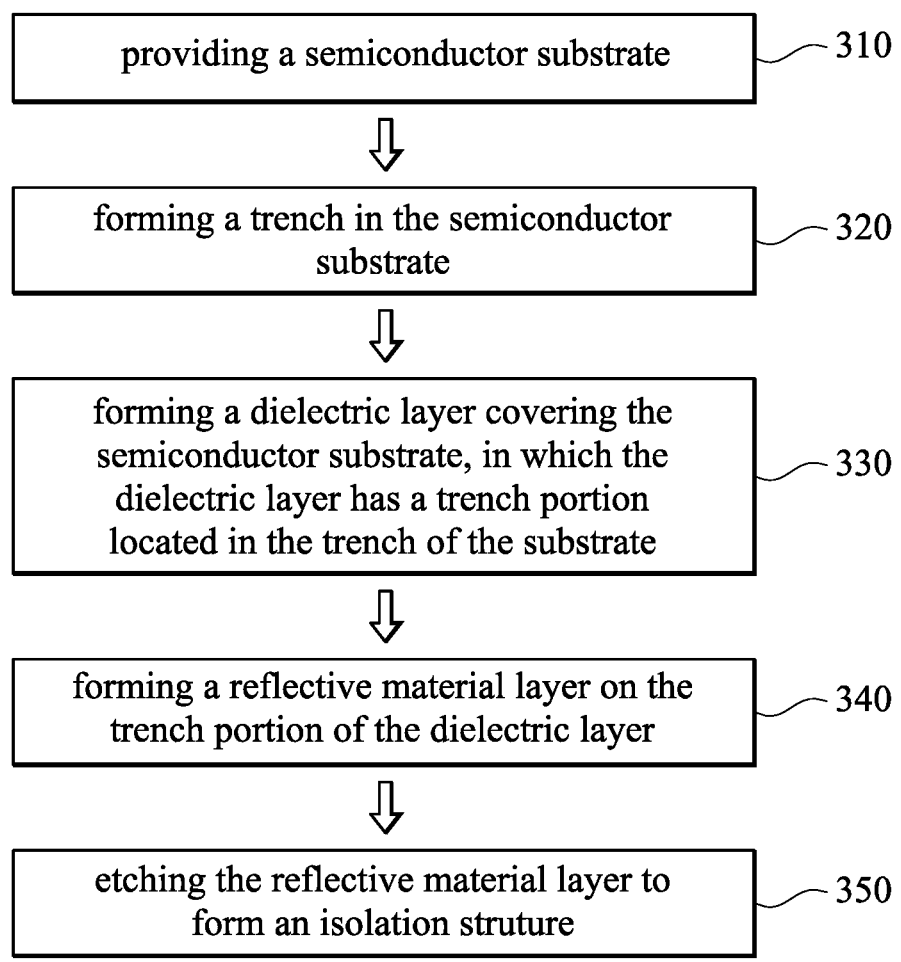
FIG. 3 is a flow chart showing a method for fabricating a semiconductor device including an isolation structure in accordance with embodiments of the present disclosure.

Referring to FIG. 3, FIG. 3 is a flow chart showing a method 300 for fabricating a semiconductor device including an isolation structure in accordance with embodiments of the present disclosure. The method 300 begins at operation 310. Operation 310 is performed to provide the semiconductor substrate 210 as shown in FIG. 2A. Then, operation 320 is performed to form the trench TR21 in the semiconductor substrate 210 as shown in FIG. 2B. Thereafter, operation 330 is performed to form a dielectric layer including the first dielectric layer 220 and the second dielectric layer 230 on the semiconductor substrate 210 as shown in FIG. 2C and FIG. 2D, in which the dielectric layer has a trench portion including the trench portions 222 and 232 located in the trench TR21, and the first dielectric layer 220 and the second dielectric layer 230 are formed by depositing dielectric materials on the semiconductor substrate 210.

Then, operation 340 is performed to form the reflective material layer 240 on the trench portions 222 and 232 as shown in FIG. 2E. In operation 340, the top portion 242 of the reflective material layer 240 is formed to have a height H2 in a range from 1000 angstrom (Å) to 5000 angstrom in some embodiments.

Thereafter, operation 350 is performed to etch the reflective material layer 240 to form the isolation structure 250 used as an isolation structure, as shown in FIG. 2F.

In the method 300, the isolation structure 250 is formed by etching the reflective material layer 240 having a bottom portion 244 located in the trench TR21 of the semiconductor substrate 210. Therefore, the cost for fabricating the isolation structure is reduced.

Figure 4:
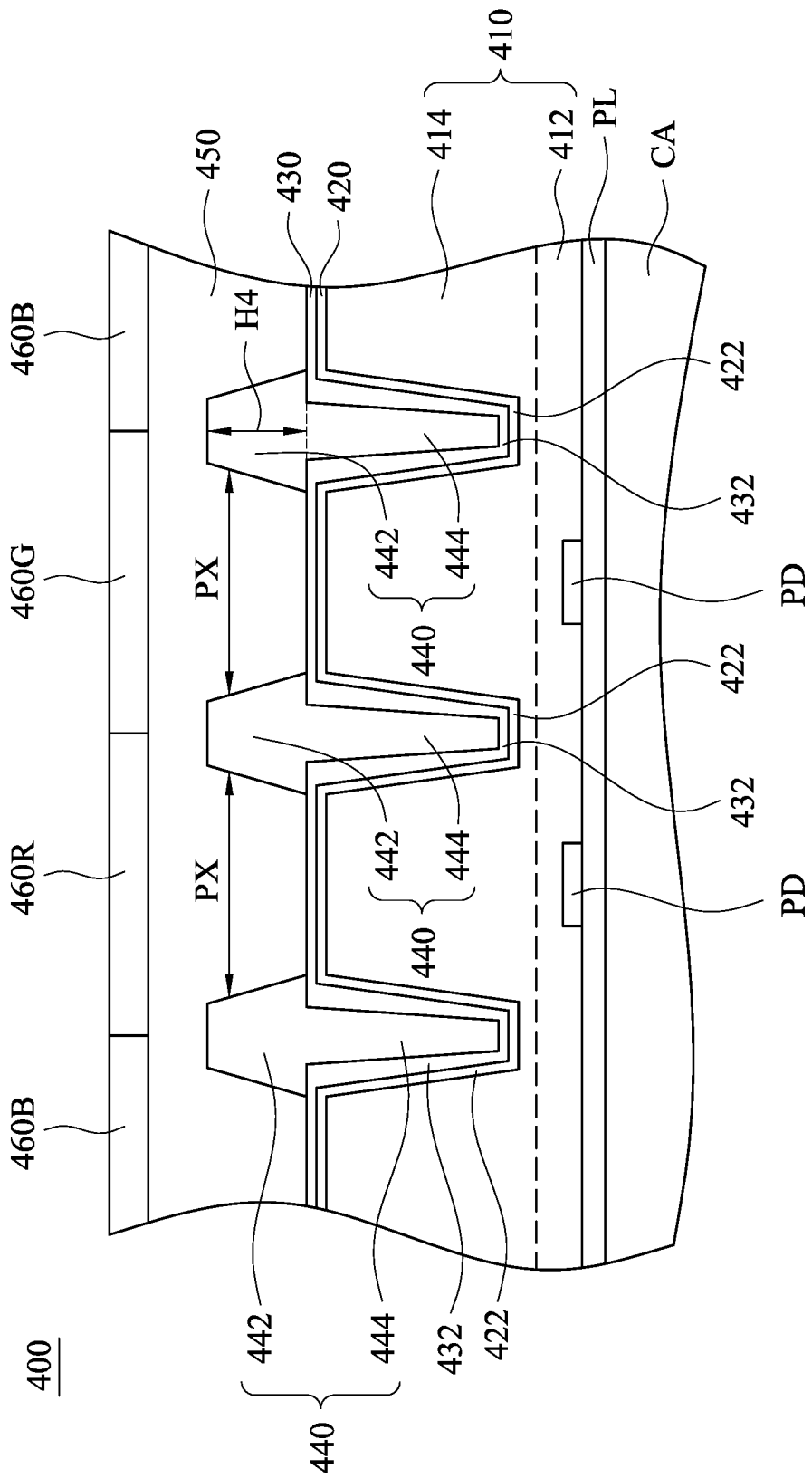
FIG. 4 is a schematic cross-sectional view of an image sensor in accordance with some embodiments of the present disclosure.

Referring to FIG. 4, FIG. 4 is a schematic cross-sectional view of an image sensor 400 in accordance with some embodiments of the present disclosure. The image sensor 400 includes a semiconductor substrate 410, a first dielectric layer 420, a second dielectric layer 430, plural isolation structures 440, a passivation layer 450, plural color filters 460R, 460G and 460B and plural light-sensitive elements PD. The semiconductor substrate 410 has a bottom portion 412 and a top portion 414. The light-sensitive elements PD are formed in or on the bottom portion 412, and the isolation structures 440 are formed on the top portion 414 of the semiconductor substrate 410.

In some embodiments, the light-sensitive elements PD are photo-diodes. In some embodiments, the semiconductor substrate 410 may be a semiconductor material and may include structures including a graded layer or a buried oxide, for example. In some exemplary examples, the semiconductor substrate 410 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 410. Alternatively, the semiconductor substrate 410 may be an active layer of a semiconductor-on-insulator (SOI) substrate or a multi-layered structure such as a silicon-germanium layer formed on a bulk silicon layer.

The first dielectric layer 420 covers the top portion 414 of the semiconductor substrate 410 and has trench portions 422 located in trenches of the semiconductor substrate 410. In this embodiment, the trench portions 122 are conformal to the trenches of the semiconductor substrate 410, but embodiments of the present invention are not limited thereto. The second dielectric layer 430 covers the first dielectric layer 420 and has trench portions 432 located in trenches formed by the trench portions 422.

In some embodiments, the first dielectric layer 420 and the second dielectric layer 430 are formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HMO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO2-Al2O3) alloy, or another suitable material.

In some embodiments, the first dielectric layer 420 and the second dielectric layer 430 can be formed by a deposition process such as an atomic layer deposition (ALD). Other methods to form the first dielectric layer 420 and the second dielectric layer 430 include chemical vapor deposition (CVD), physical vapor deposition (PVD), and plasma enhanced chemical vapor deposition (PECVD).

The isolation structures 440 are used to define plural pixel regions PX corresponding to the photo-sensitive elements PD in a one-to-one manner. Each of the isolation structures 140 includes a top portion 442 and a bottom portion 444. The top portions 442 of the isolation structures 440 are located on the second dielectric layer 430 and cover the trench portions 432 of the second dielectric layer 430. The bottom portions 444 of the isolation structures 440 extend in trenches formed by the trench portion 432 of the second dielectric layer 130 from the top portions 442 of the isolation structures 440. In some embodiments, a height H4 of each of the top portions 442 of the isolation structures 440 is substantially in a range from 1000 angstrom (Å) to 5000 angstrom.

The isolation structures 440 are formed by a reflective material capable of reflecting light emitted to the isolation structure 440, thus light of the pixel regions PX are isolated from each other. In some embodiments, the reflective material includes metal, such as aluminum, tungsten, copper, tantalum, titanium, alloys thereof, or combinations thereof. In some embodiments, the isolation structures 440 can be formed by a deposition process such as an atomic layer deposition (ALD). Other methods to form the isolation structures 440 include chemical vapor deposition (CVD), physical vapor deposition (PVD), and plasma enhanced chemical vapor deposition (PECVD).

The passivation layer 450 is formed on the isolation structures 440 to prevent the isolation structures 440 from being damaged. In this embodiment, the passivation layer 450 is an oxide layer, but embodiments of the present disclosure are not limited thereto.

The color filters 460R, 460G and 460B are formed on the passivation layer 450, and correspond to the pixel regions PX in a one-to-one manner. In this embodiment, the color filter 460R is a red color filter, the color filter 460G is a green color filter and the color filter 460B is a blue color filter, but embodiments of the present disclosure are not limited thereto.

In some embodiments, a passivation layer PL is formed on the bottom portion 412 of the semiconductor substrate 410 to protect the bottom portion 412 of the semiconductor substrate 410. In some embodiments, a carrier CA is disposed on the passivation layer PL to support the semiconductor substrate 410.

Figure 5A:
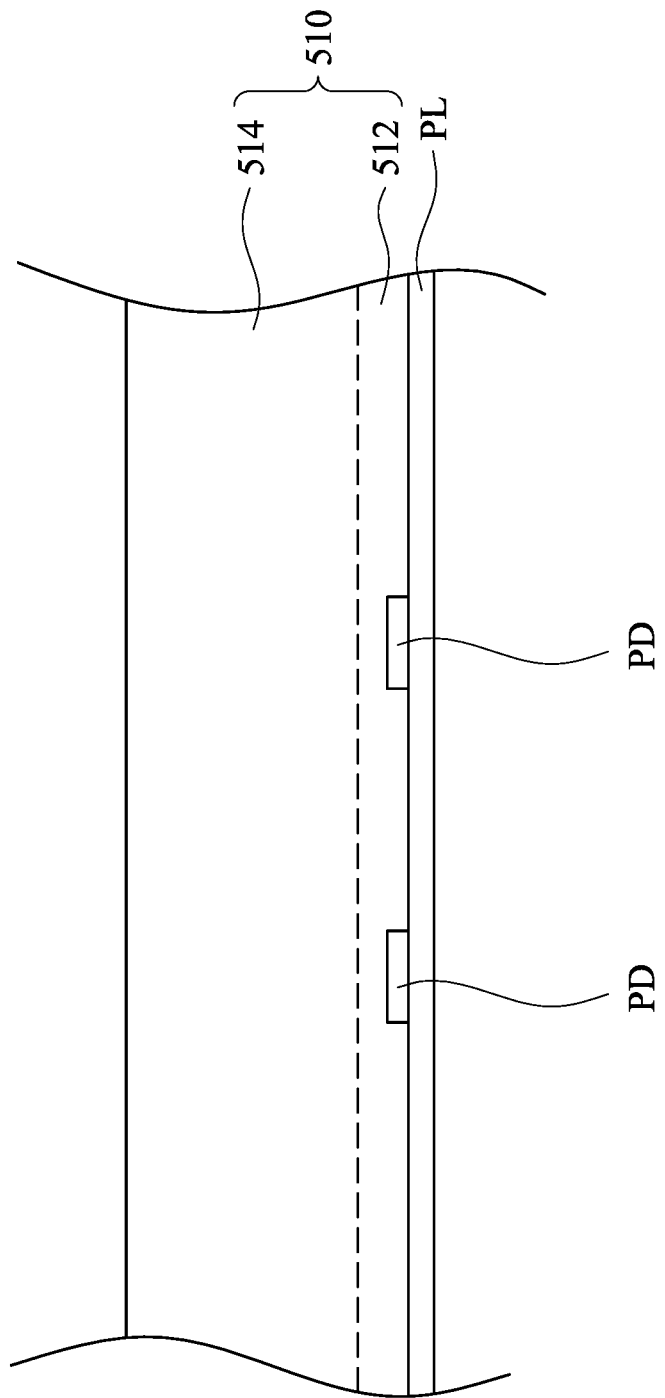
FIG. 5A to FIG. 5I are cross-sectional views of intermediate stages showing a method for fabricating an image sensor including in accordance with some embodiments of the present disclosure.
Figure 5B:
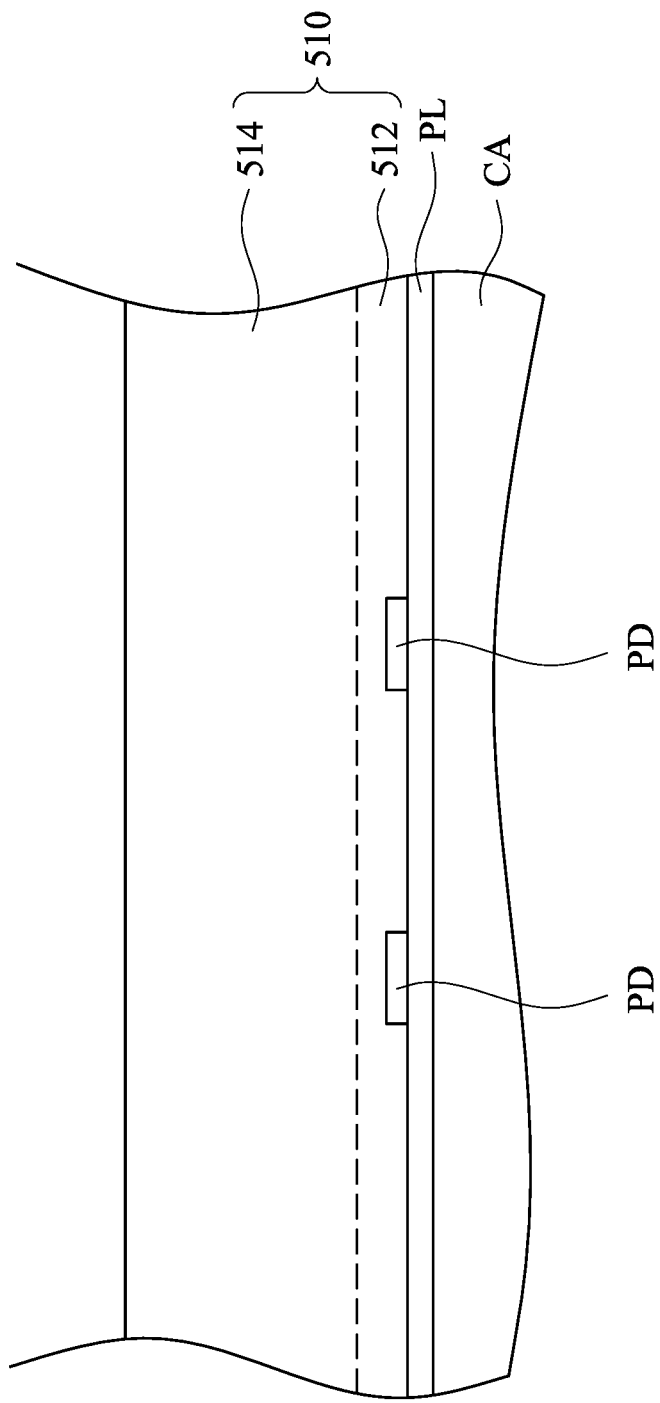

FIG. 5A to FIG. 5I are cross-sectional views of intermediate stages showing a method for fabricating an image sensor 500 including in accordance with some embodiments of the present disclosure. At first, a semiconductor substrate 510 is provided as shown in FIG. 5A. The semiconductor substrate 510 has a bottom portion 512 and a top portion 514 and plural light-sensitive elements PD are formed in the bottom portion 512. In some embodiments, a passivation layer PL is formed on the bottom portion 512 of the semiconductor substrate 510 to protect the bottom portion 512 of the semiconductor substrate 510. In some embodiments, a carrier CA is disposed on the passivation layer PL to support the semiconductor substrate 510 as shown in FIG. 5B.

The semiconductor substrate 510 may be a semiconductor material. In some embodiments, the semiconductor substrate 510 may include structures including a graded layer or a buried oxide, for example. In some exemplary examples, the semiconductor substrate 510 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 510. Alternatively, the semiconductor substrate 510 may be an active layer of a semiconductor-on-insulator (SOI) substrate or a multi-layered structure such as a silicon-germanium layer formed on a bulk silicon layer.

Figure 5C:
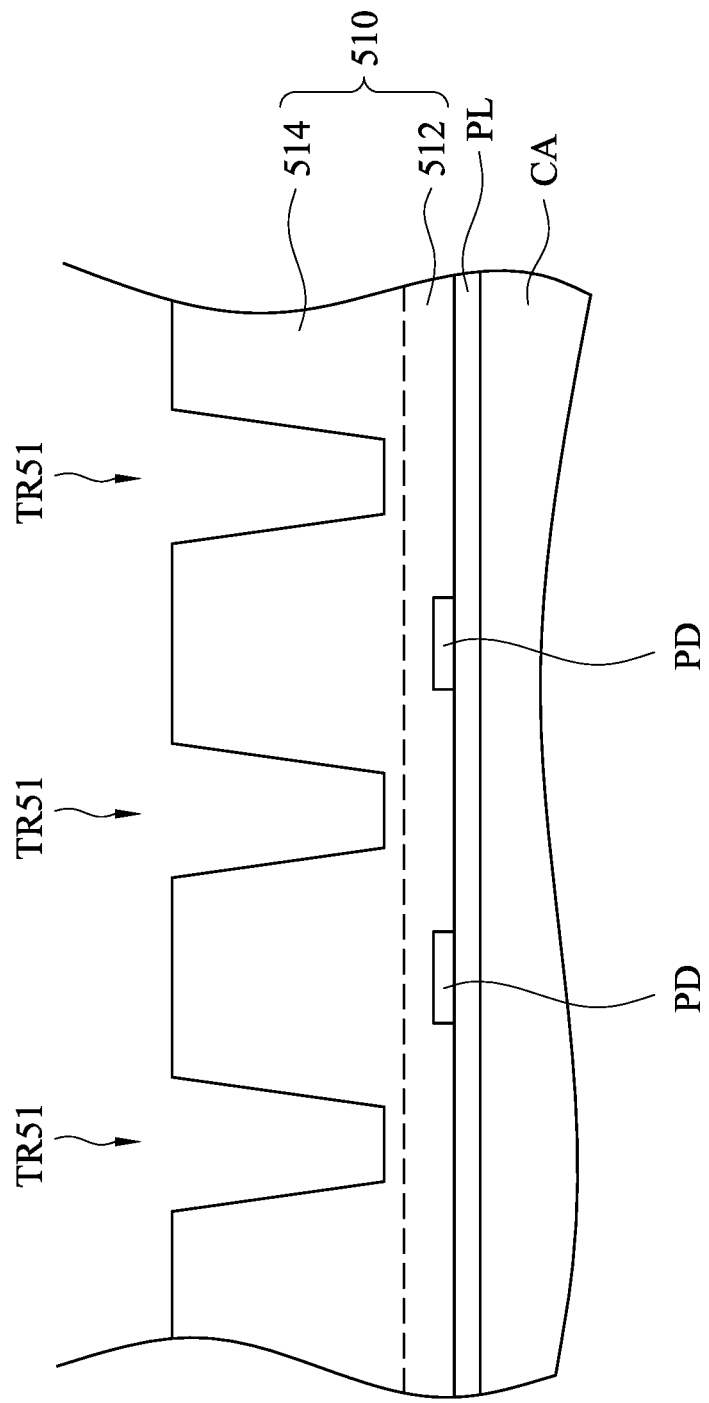

Then, trenches TR51 are formed in the top portion 514 of the semiconductor substrate 510 as shown in FIG. 5C. The trenches TR51 can be formed by a wet etching process or a dry etching process. However, embodiments of the present disclosure are not limited thereto.

Figure 5D:
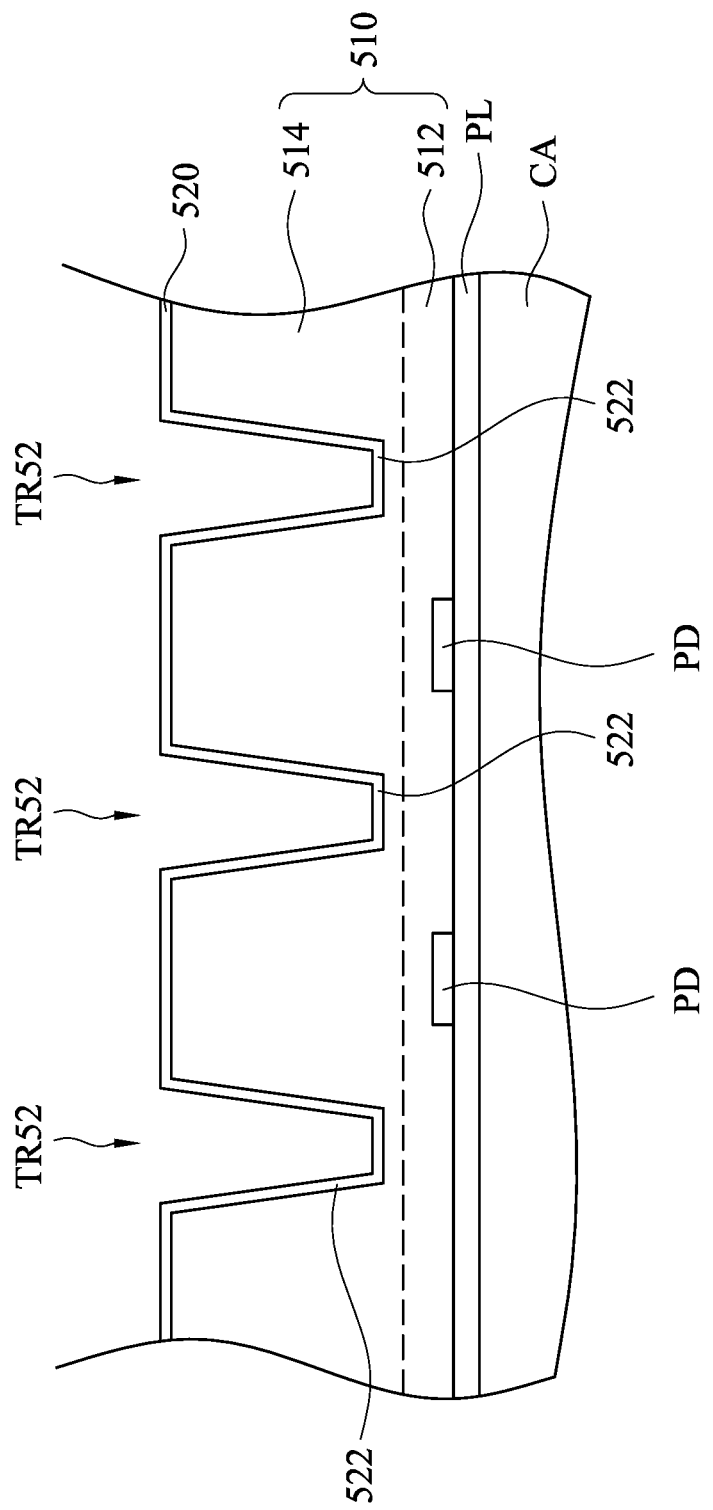

Thereafter, a first dielectric layer 520 is formed on the top portion 514 of the semiconductor substrate 510 as shown in FIG. 5D. The first dielectric layer 220 covers the top portion 514 of the semiconductor substrate 510 and includes trench portions 522 formed in the trenches TR21. The trench portions 522 are formed along sidewalls and a bottom of the trenches TR21, thereby forming trenches TR52. In this embodiment, the trench portions 522 of the first dielectric layer 520 are conformal to the trenches TR51, but embodiments of the present disclosure are not limited thereof.

In some embodiments, the first dielectric layer 520 is formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO2-Al2O3) alloy, or another suitable material.

In some embodiments, the first dielectric layer 520 can be formed by a deposition process such as an atomic layer deposition (ALD). Other methods to form the first dielectric layer 520 and the second dielectric layer 130 include chemical vapor deposition (CVD), physical vapor deposition (PVD), and plasma enhanced chemical vapor deposition (PECVD).

Figure 5E:
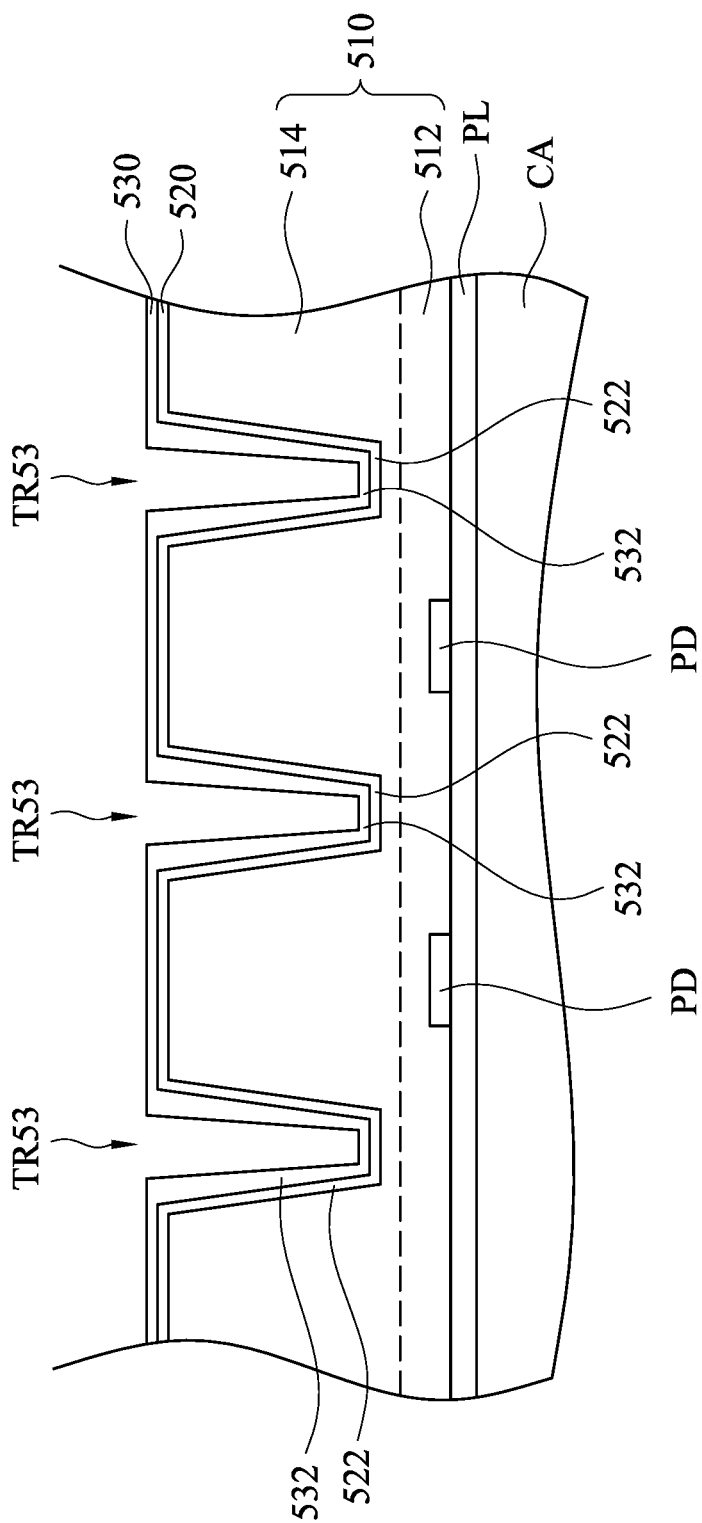

Then, a second dielectric layer 530 is formed on the first dielectric layer 520 as shown in FIG. 5E. The second dielectric layer 530 covers the first dielectric layer 520 and includes trench portions 532 formed in the trenches TR52. The trench portions 532 are formed along the trench portions 522 of the first dielectric layer 520, thereby forming trenches TR53.

In some embodiments, the second dielectric layer 530 is formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO2-Al2O3) alloy, or another suitable material.

In some embodiments, the second dielectric layer 530 can be formed by a deposition process such as an atomic layer deposition (ALD). Other methods to form the second dielectric layer 530 include chemical vapor deposition (CVD), physical vapor deposition (PVD), and plasma enhanced chemical vapor deposition (PECVD).

Figure 5F:
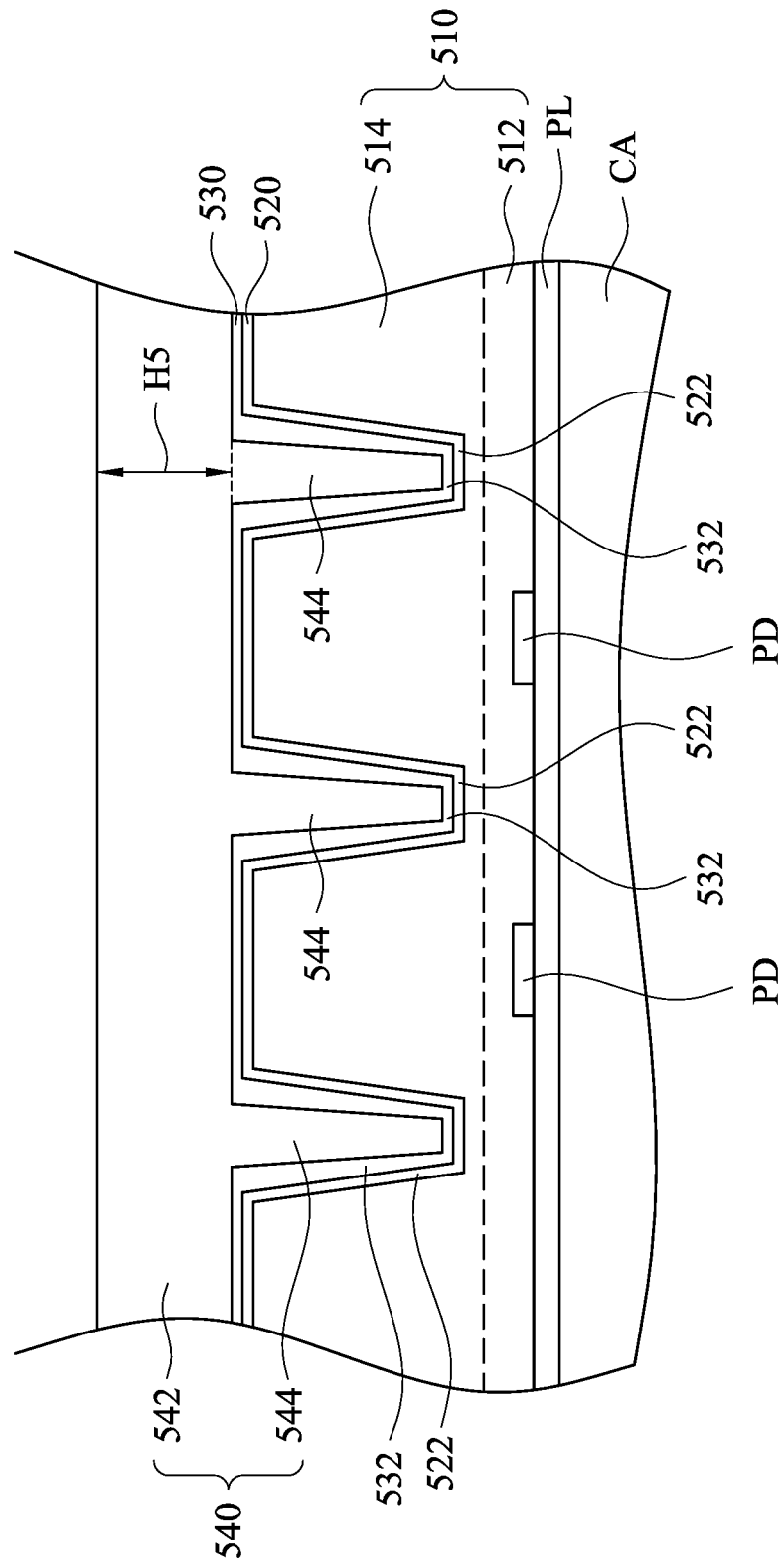

Thereafter, a reflective material layer 540 is formed on the trench portions 532 of the second dielectric layer 530 as shown in FIG. 5F. The reflective material layer 540 covers the second dielectric layer 530 and includes a top portion 542 and bottom portions 544. The bottom portions 544 of the reflective material layer 540 are formed in the trenches TR53, and the top portion 542 of the reflective material layer 540 is located on the bottom portion 544 of the reflective material layer 540. In some embodiments, the top portion 542 of the reflective material layer 540 has a height H5 in a range from 1000 angstrom (Å) to 5000 angstrom.

The reflective material layer 540 is capable of reflecting light. In some embodiments, the reflective material layer 540 can be formed by metal, such as aluminum, tungsten, copper, tantalum, titanium, alloys thereof, or combinations thereof. In some embodiments, the reflective material layer 540 can be formed by a deposition process such as an atomic layer deposition (ALD). Other methods to form the reflective material layer 540 include chemical vapor deposition (CVD), physical vapor deposition (PVD), and plasma enhanced chemical vapor deposition (PECVD).

Figure 5G:
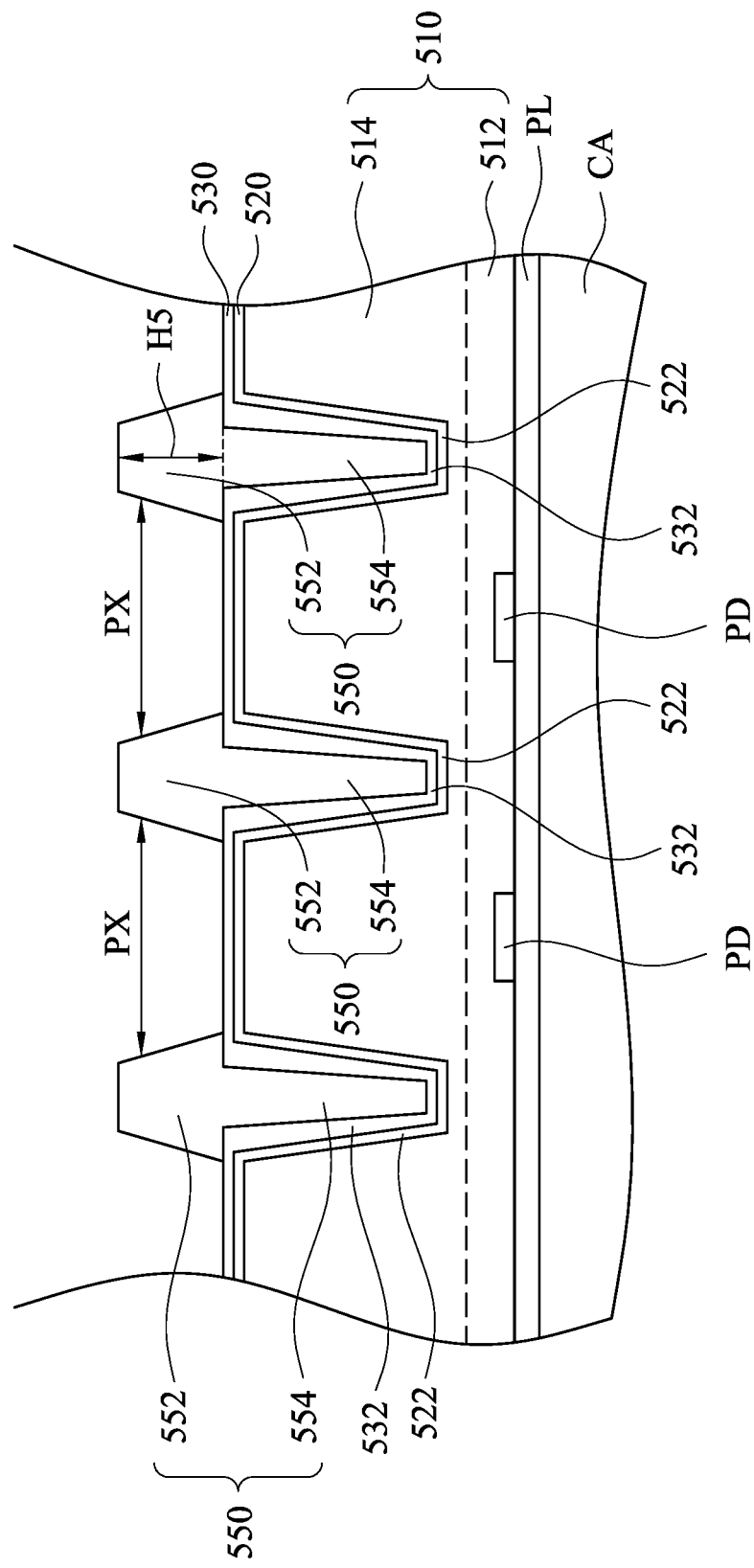

Then, the reflective material layer 540 is etched to form isolation structures 550 to define plural pixel regions PX corresponding to the photo-sensitive elements PD in a one-to-one manner, as shown in FIG. 5G. Each of the isolation structures 550 includes a top portion 552 and a bottom portion 554. In this embodiment, the top portion 542 of the reflective material layer 540 is etched to form the top portions 552 of the isolation structure 550, and the bottom portions 544 of reflective material layer 240 located in the trenches TR53 are not etched and can be considered as the bottom portions 554 of the isolation structures 550. Therefore, the bottom portions 554 of the isolation structures 550 extend in the trenches TR53 from the top portions 552 of the isolation structures 550. In some embodiments, each of the top portions 552 of the isolation structures 550 has a height the same as the height H5 of the top portion 542 of the reflective material layer 540.

Figure 5H:
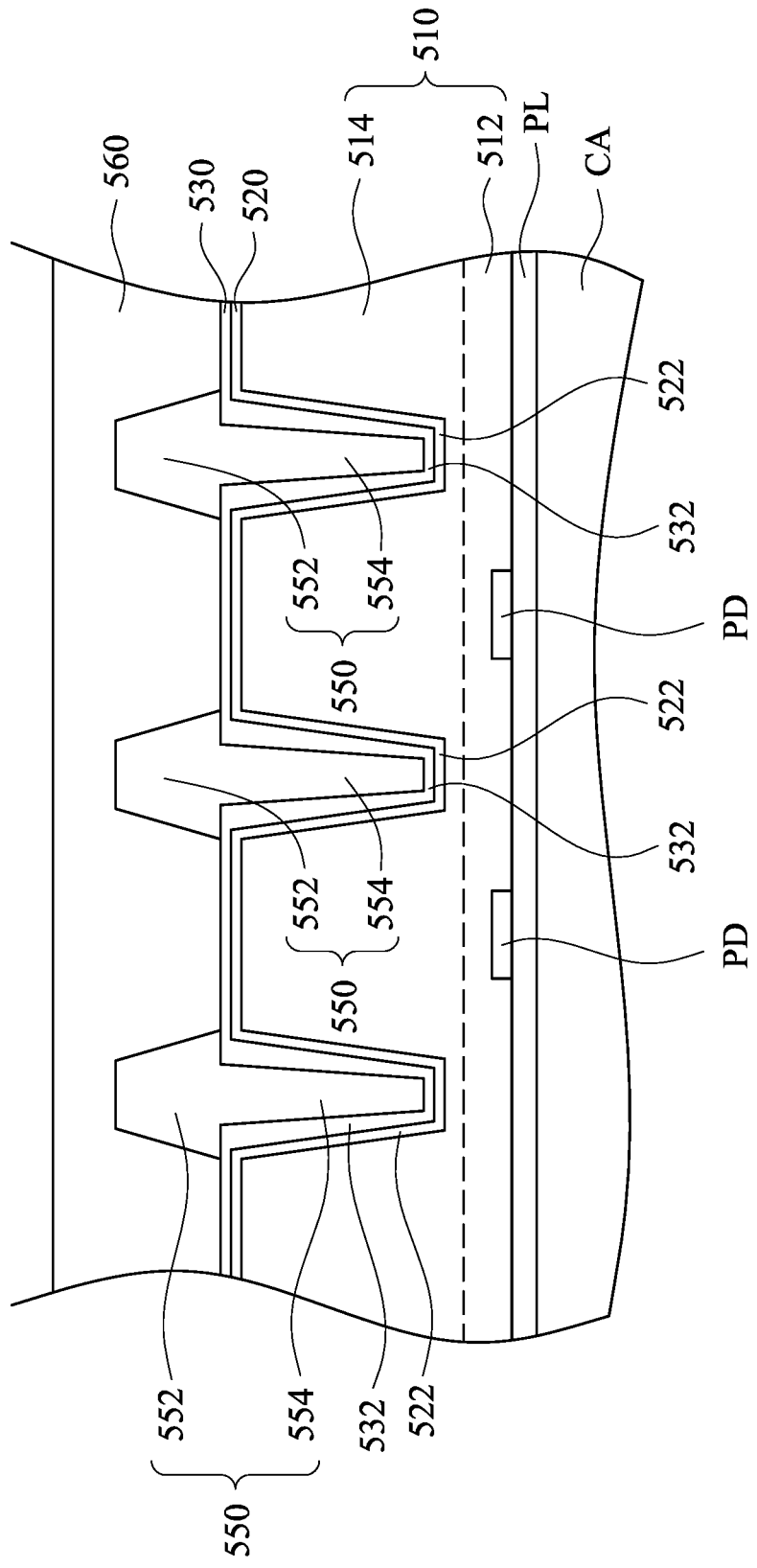

Thereafter, a passivation layer 560 is formed on the isolation structures 550 as shown in FIG. 5H. The passivation layer 560 is used to prevent the isolation structures 550 from being damaged. For example, the isolation structure 550 may be oxidized when being exposed to air. In this embodiment, the passivation layer 560 is an oxide layer, but embodiments of the present disclosure are not limited thereto.

Then, color filters 570R, 570G and 570B are formed on the passivation layer 460, and correspond to the pixel regions PX in a one-to-one manner. In this embodiment, the color filter 570R is a red color filter, the color filter 570G is a green color filter and the color filter 570B is a blue color filter, but embodiments of the present disclosure are not limited thereto.

Figure 6:
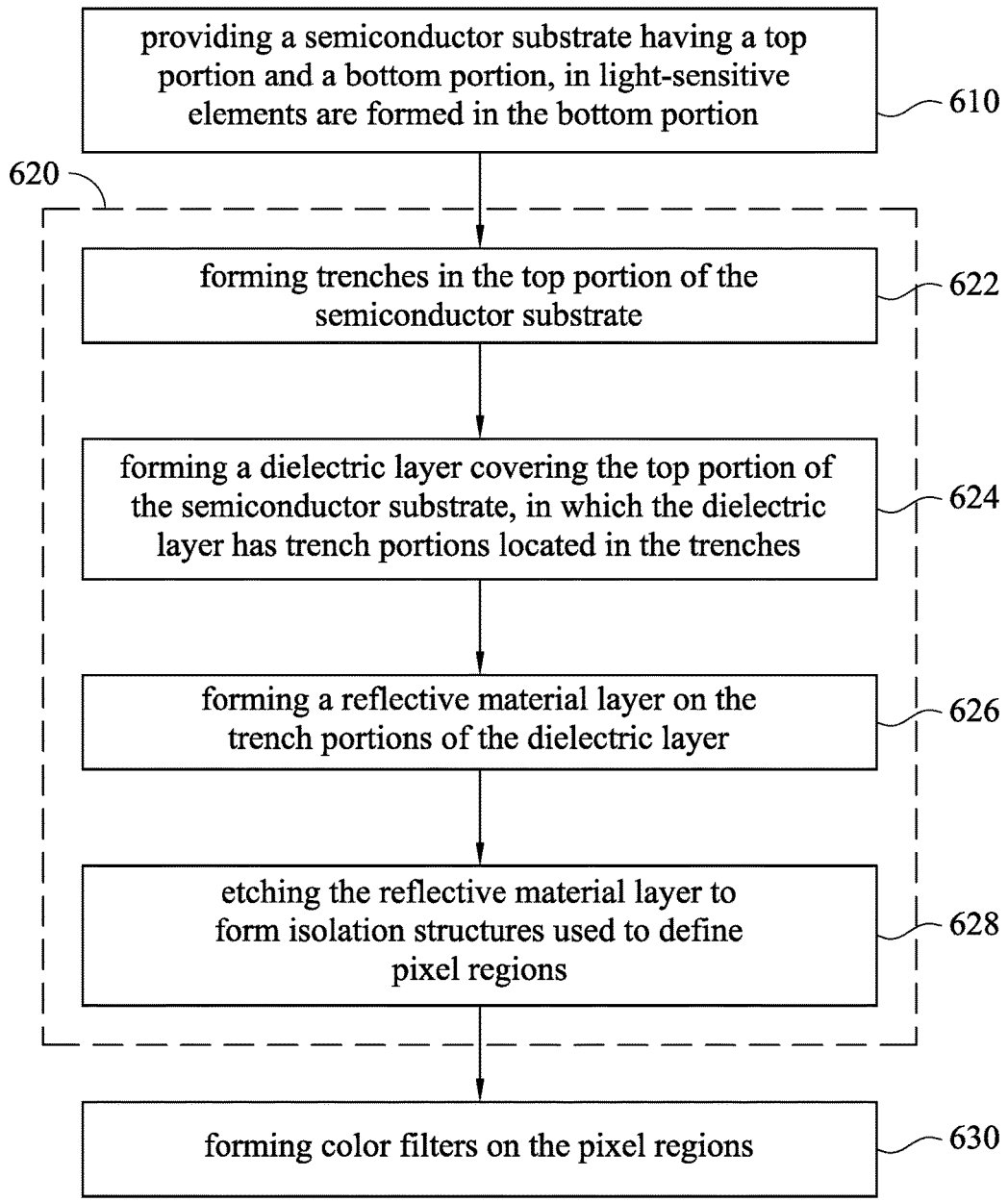
FIG. 6 is a flow chart showing a method for fabricating an image sensor in accordance with embodiments of the present disclosure.

Referring to FIG. 6, FIG. 6 is a flow chart showing a method 600 for fabricating an image sensor in accordance with embodiments of the present disclosure. The method 600 begins at operation 610. Operation 610 is performed to provide the semiconductor substrate 510 as shown in FIG. 5A and FIG. 5B, in which the light-sensitive elements PD are formed in the bottom portion 512 of the semiconductor substrate 510. Then, operation 620 is performed to form isolations structures on the semiconductor substrate 510. In operation 620, at first, operation 622 is performed to form the trenches TR51 in the top portion 514 of the semiconductor substrate 510 as shown in FIG. 5C. Thereafter, operation 624 is performed to form a dielectric layer including the first dielectric layer 520 and the second dielectric layer 530 covering the top portion 514 of the semiconductor substrate 510 as shown in FIG. 5D and FIG. 5E, in which the dielectric layer has trench portions including the trench portions 522 and 532 located in the trenches TR51, and the first dielectric layer 520 and the second dielectric layer 530 are formed by depositing dielectric materials on the semiconductor substrate 510.

Then, operation 626 is performed to form the reflective material layer 540 on the trench portions 522 and 532 as shown in FIG. 5F. In operation 626, the top portion 542 of the reflective material layer 540 is formed to have a height H5 in a range from 1000 angstrom (Å) to 5000 angstrom in some embodiments. Thereafter, operation 628 is performed to etch the reflective material layer 540 to form the isolation structures 550 to define the pixel regions PX as shown in FIG. 5G. In some embodiments, the passivation layer 560 is formed on the isolation structures 550 as shown in FIG. 5H.

Figure 5I:
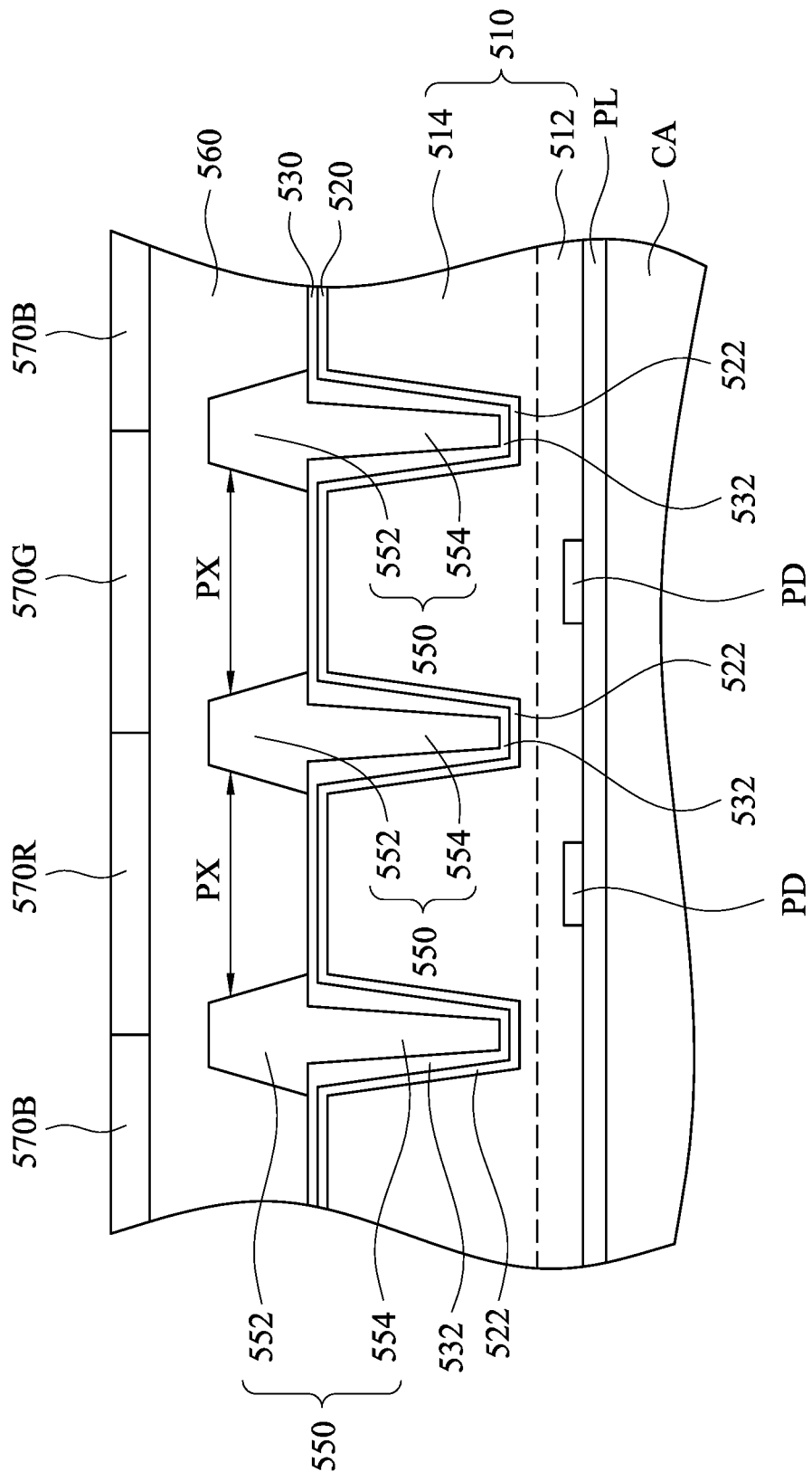

After operation 620 for forming the isolation structures 550, operation 630 is performed to form the color filters 570R, 570G and 570B on the pixel regions in a one-to-one manner as shown in FIG. 5I.

It can be understood that the isolation structure 550 is formed by etching the reflective material layer 540, thus cost of the method 600 for fabricating the image sensor 500 is reduced.

In accordance with an embodiment of the present disclosure, the present disclosure discloses a method for fabricating a semiconductor device. In the method, at first, a semiconductor substrate is provided. Then, a trench is formed in the semiconductor substrate. Thereafter, a dielectric layer is formed to cover the semiconductor substrate, in which the dielectric layer has a trench portion located in the trench of the semiconductor substrate. Then, a reflective material layer is formed on the trench portion of the dielectric layer. Thereafter, the reflective material layer is etched to form an isolation structure, in which the isolation structure includes a bottom portion in a trench formed by the trench portion of the dielectric layer and a top portion located on the bottom portion of the isolation structure.

In accordance with another embodiment of the present disclosure, the present disclosure discloses a semiconductor device. The semiconductor device includes a semiconductor substrate, a dielectric layer and an isolation structure. The semiconductor substrate has a trench. The dielectric layer covers the semiconductor substrate, in which the dielectric layer has a trench portion located in the trench of the semiconductor substrate. The isolation structure is formed on the dielectric layer, in which the isolation structure includes a top portion located on the semiconductor substrate and a bottom portion extending in a trench formed by the trench portion of the dielectric layer from the top portion of the isolation structure.

In accordance with another embodiment of the present disclosure, the present disclosure discloses an image sensor. The image sensor includes a semiconductor substrate, a plurality of light-sensitive elements, a dielectric layer and a plurality of isolation structures. The semiconductor substrate has a top portion and a bottom portion. The light-sensitive elements are formed in or on the bottom portion of the semiconductor substrate. The dielectric layer covers the top portion of the semiconductor substrate, in which the dielectric layer has a plurality of trench portions located in a plurality of trenches formed in the top portion of the semiconductor substrate. The isolation structures are formed on the dielectric layer to define a plurality of pixel regions on the semiconductor substrate, in which each of the isolation structures includes a top portion located on the semiconductor substrate and a bottom portion extending in a trench formed by one of the trench portions of the dielectric layer from the top portion of the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, the method comprising:
   forming a first trench in a semiconductor substrate;
   forming a dielectric layer covering the semiconductor substrate, wherein the dielectric layer has a trench portion located in the first trench of the semiconductor substrate;
   forming a reflective material layer on the trench portion of the dielectric layer; and
   etching the reflective material layer to form an isolation structure, wherein the isolation structure comprises a bottom portion in a second trench formed by the trench portion of the dielectric layer and a top portion located on the bottom portion of the isolation structure, wherein a top surface of the top portion of the isolation structure is in a position higher than a top surface of the semiconductor substrate.

2. The method of claim 1, wherein the dielectric layer comprises a first dielectric layer and a second dielectric layer formed on the first dielectric layer.

3. The method of claim 2, wherein forming the dielectric layer comprises:
   depositing a first dielectric material on the semiconductor substrate to form the first dielectric layer, wherein the first dielectric layer includes a trench portion located in the first trench, and the trench portion of the first dielectric layer is conformal to the first trench; and
   depositing a second dielectric material on the first dielectric layer to form the second dielectric layer, wherein a portion of the second dielectric layer is formed along sidewalls of the trench portion of the first dielectric layer to form the trench portion of the dielectric layer.

4. The method of claim 1, wherein the dielectric layer is a high-k dielectric layer.

5. The method of claim 1, wherein the reflective material layer is a metal layer.

6. The method of claim 1, wherein the top portion of the isolation structure has a height in a range from 1000 angstrom (Å) to 5000 angstrom.

7. The method of claim 1, wherein the reflective material layer is formed by using chemical vapor deposition.

8. The method of claim 1, wherein the semiconductor substrate has a top portion and a bottom portion, and the bottom portion of the semiconductor substrate comprises a plurality of light-sensitive elements, and the first trench is formed in the top portion of the semiconductor substrate.

9. A method for fabricating a semiconductor device, the method comprising:
   forming a plurality of first trenches in a semiconductor substrate;
   forming a dielectric layer covering the semiconductor substrate, wherein the dielectric layer has a plurality of trench portions located in the first trenches of the semiconductor substrate and a top portion external to the first trenches and over a top surface of the semiconductor substrate;
   forming a reflective material layer on the trench portions of the dielectric layer; and
   etching the reflective material layer to form a plurality of isolation structures, wherein each of the isolation structures comprises a bottom portion in a second trench formed by one of the trench portions of the dielectric layer and a top portion located on the bottom portion of the isolation structure, wherein the top portions of the isolation structures are in contact with a top surface of the top portion of the dielectric layer.

10. The method of claim 9, wherein the dielectric layer is a high-k dielectric layer.

11. The method of claim 9, wherein the reflective material layer is a metal layer.

12. The method of claim 9, wherein the top portion of each of the isolation structures has a height in a range from 1000 angstrom (Å) to 5000 angstrom.

13. The method of claim 9, wherein the reflective material layer is formed by using chemical vapor deposition.

14. The method of claim 9, wherein the semiconductor substrate has a top portion and a bottom portion, and the bottom portion of the semiconductor substrate comprises a plurality of light-sensitive elements, and the first trenches are formed in the top portion of the semiconductor substrate.

15. A method for fabricating a semiconductor device, the method comprising:

providing a semiconductor substrate having a top portion and a bottom portion, wherein a plurality of light-sensitive elements are formed in the bottom portion;

forming a plurality of first trenches in the top portion of the semiconductor substrate;

forming a dielectric layer covering the top portion of the semiconductor substrate, wherein the dielectric layer has trench portions located in the first trenches of the semiconductor substrate;

forming a reflective material layer on the trench portions of the dielectric layer;

etching the reflective material layer to form a plurality of isolation structures used to define a plurality of pixel regions, wherein each of the isolation structures comprises a bottom portion in a second trench formed by one of the trench portions of the dielectric layer and a top portion located on the bottom portion of the isolation structure, and the top portion of each of the isolation structures tapers away from the bottom portion of the semiconductor substrate; and forming a plurality of color filters on the pixel regions.

16. The method of claim 15, wherein the dielectric layer is a high-k dielectric layer.

17. The method of claim 15, wherein the reflective material layer is a metal layer.

18. The method of claim 15, wherein the top portion of each of the isolation structures has a height in a range from 1000 angstrom (Å) to 5000 angstrom.

19. The method of claim 15, wherein the reflective material layer is formed by using chemical vapor deposition.

20. The method of claim 15, wherein the light-sensitive elements are photo-diodes.

* * * * *